United States Patent
Cai et al.

(10) Patent No.: US 7,809,081 B2
(45) Date of Patent: *Oct. 5, 2010

(54) DIGITAL PRE-DISTORTION TECHNIQUE USING NONLINEAR FILTERS

(75) Inventors: Khiem V. Cai, Brea, CA (US); David B. Rutan, Manhattan Beach, CA (US); Matthew S. Gorder, Riverside, CA (US); Don C. Devendorf, Carlsbad, CA (US)

(73) Assignee: Microelectronics Technology, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/574,796

(22) Filed: Oct. 7, 2009

(65) Prior Publication Data

US 2010/0020900 A1     Jan. 28, 2010

Related U.S. Application Data

(63) Continuation of application No. 11/150,445, filed on Jun. 9, 2005, now Pat. No. 7,606,322.

(60) Provisional application No. 60/616,714, filed on Oct. 7, 2004.

(51) Int. Cl.
*H04K 1/02*     (2006.01)

(52) U.S. Cl. .................. 375/296; 375/297; 375/254; 330/2; 330/149

(58) Field of Classification Search ............. 375/297, 375/296

See application file for complete search history.

(56) References Cited

U.S. PATENT DOCUMENTS

| | | | |
|---|---|---|---|
| 4,078,245 A | 3/1978 | Johnson et al. | |
| 5,031,133 A | 7/1991 | Sasaki | |
| 6,038,251 A | 3/2000 | Chen | |
| 6,263,077 B1 | 7/2001 | Zuranski et al. | |
| 6,320,902 B1 | 11/2001 | Nafie et al. | |
| 6,903,604 B2 | 6/2005 | Kim | |

(Continued)

OTHER PUBLICATIONS

Lei Ding et al., A Robust Digital Baseband Predistorter Constructed Using Memory Polynomials, Manuscript submitted to the IEEE Trans. On Communication, Mar. 16, 2002, pp. 1-23.

(Continued)

*Primary Examiner*—Shuwang Liu
*Assistant Examiner*—Lihong Yu
(74) *Attorney, Agent, or Firm*—Carlos R. Villamar; The Villamar Firm PLLC

(57) ABSTRACT

A method and computer program product for operating a linearizer for a circuit, including generating a set of coefficients via a characterizer; predistorting a signal input to the circuit responsive to the coefficients and generating a linearized output in response thereto; filtering the signal through a linear digital filter having linear digital filter taps, each tap other than a first tap being successively delayed by one delay unit; generating powers of the signal; inputting the generated powers of the signal through tapped delay lines, each line having nonlinear digital filter taps, each tap other than a first tap being successively delayed by one delay unit; applying the coefficients to the linear and nonlinear digital filter taps; summing each of the nonlinear digital filter taps corresponding to a certain number of delay units; and adding the sum of each of the delay units to a particular linear digital filter tap.

10 Claims, 5 Drawing Sheets

U.S. PATENT DOCUMENTS

| | | |
|---|---|---|
| 7,003,051 B2 | 2/2006 | Francos et al. |
| 7,035,345 B2 | 4/2006 | Jacklen et al. |
| 7,194,043 B2 | 3/2007 | Ma |
| 7,606,322 B2 * | 10/2009 | Cai et al. ............... 375/296 |
| 2003/0063686 A1 | 4/2003 | Giardina |
| 2005/0069050 A1 | 3/2005 | Ding et al. |
| 2006/0078065 A1 | 4/2006 | Cai et al. |
| 2008/0095265 A1 | 4/2008 | Cai et al. |

OTHER PUBLICATIONS

U.S. Appl. No. 12/580,618, filed Oct. 16, 2009, Khiem V. Cai.

* cited by examiner

DIGITAL PRE-DISTORTION TECHNIQUE USING NONLINEAR FILTERS

CROSS REFERENCE TO RELATED DOCUMENTS

The present invention is a continuation of U.S. patent application Ser. No. 11/150,445 of Cai et al., entitled "DIGITAL PRE-DISTORTION TECHNIQUE USING NONLINEAR FILTERS," filed on Jun. 9, 2005, now allowed, which claims benefit of priority to U.S. Provisional Patent Application Ser. No. 60/616,714 of Devendorf et al., entitled "DIGITAL PRE-DISTORTION TECHNIQUE USING NON-LINEAR FILTERS," filed on Oct. 7, 2004, the entire disclosures of all of which are hereby incorporated by reference herein.

BACKGROUND OF THE INVENTION

1. Field of the Invention

The present invention relates to electrical and electronic circuits and systems. More specifically, the present invention relates to power amplifiers for communications systems and predistortion linearizers used in connection therewith.

2. Discussion of the Background

Power amplifiers are used in a variety of communications applications. Power amplifiers not only typically exhibit non-linear distortion but also possess memory effects. While nonlinear distortion follows the power amplifier characteristics, the memory effects depend on signal characteristics (e.g., signal bandwidth and also transmit power level.)

Conventional techniques use Lookup Table (LUT) based methods to generate inverse transfer functions in both amplitude and phase to correct for non-linearity in the output of power amplifiers. However these techniques do not effectively handle memory effects and thus provide very moderate linearization improvements.

More importantly, power amplifiers are generally expensive and consume much power. Multiple carrier applications, such as cellular telephone base stations, are particularly problematic inasmuch as a single amplifier is typically used with each carrier signal. Conventional approaches combine separate power amplifiers to transmit multiple carrier signals. However, this approach is also expensive and power intensive.

Further, for maximum efficiency, each power amplifier must be driven close to its saturation point. However, as the power level is increased, intermodulation distortion (IMD) levels increase. Hence, the output power level must be 'backed-off' to maintain acceptable ACPR (adjacent channel power ratio) levels. Unfortunately, the required power back-off to meet government (e.g. FCC) specified IMD levels limits the efficiency of the power amplifier to relatively low levels and does not offer a solution that is sufficiently cost effective for certain current requirements.

An alternative approach is to use a predistortion linearizer. This technique allows power amplifiers to operate with better power efficiency, while at the same time maintaining acceptable IMD levels. However, conventional digital predistortion linearizers have, been shown to reduce the IMD levels by only about 10-13 dB for signal bandwidths in excess of 20 MHz.

Hence, a need remains in the art for an efficient, low cost system or method for amplifying multiple carrier signals while maintaining low intermodulation distortion levels.

SUMMARY OF THE INVENTION

The need in the art is addressed by the linearizer and method of the present invention. In a most general embodiment, the inventive linearizer includes a characterizer coupled to an input to and an output from said circuit for generating a set of coefficients and a predistortion engine responsive to said coefficients for predistorting a signal input to said circuit such that said circuit generates a linearized output in response thereto.

As a result, in the best mode, the weights used in the predistortion linearization engine can be computed by solving a matrix equation HW=S for W, where W is a vector of the weights, S is a vector of predistortion linearization engine outputs, and H is a matrix of PA return path inputs.

Accordingly, in exemplary aspects of the present invention there is provided a method and computer program product for operating a linearizer for a circuit, including generating a set of coefficients via a characterizer; predistorting a signal input to the circuit responsive to the coefficients and generating a linearized output in response thereto; filtering the signal through a linear digital filter having linear digital filter taps, each tap other than a first tap being successively delayed by one delay unit; generating powers of the signal; inputting the generated powers of the signal through tapped delay lines, each line having nonlinear digital filter taps, each tap other than a first tap being successively delayed by one delay unit; applying the coefficients to the linear and nonlinear digital filter taps; summing each of the nonlinear digital filter taps corresponding to a certain number of delay units; and adding the sum of each of the delay units to a particular linear digital filter tap.

In further exemplary aspects of the present invention there is provided a method and computer program product for operating a transmitter, including receiving an input signal and providing a linearized output signal in response thereto via a digital predistortion engine; coupling a power amplifier to the predistortion engine; coupling a characterizer to the power amplifier; providing in the predistortion engine circuitry configured for performing the steps of: filtering the input signal through a linear digital filter having one or more linear digital filter taps, each linear digital filter tap other than a first linear digital filter tap being successively delayed by one delay unit; generating one or more powers of the input signal; inputting one or more of the generated powers of the input signal through one or more tapped delay lines, each tapped delay line having one or more nonlinear digital filter taps, each nonlinear digital filter tap other than a first nonlinear digital filter tap being successively delayed by one delay unit; applying coefficients to the linear and nonlinear digital filter taps; summing each of the nonlinear digital filter taps corresponding to a certain number of delay units; and adding the sum of each of the delay units from the summing step to a particular linear digital filter tap.

In further exemplary aspects of the present invention there is provided a linearizer and computer program product for linearizing an output of a circuit, including sampling a signal into the circuit and output by the circuit; generating a set of coefficients in response to the sampling step; using the coefficients to predistort a signal input to the circuit whereby the circuit generates a linearized output in response thereto; and the predistortion of the signal further includes: filtering the signal through a linear digital filter having one or more linear digital filter taps, each linear digital filter tap other than a first linear digital filter tap being successively delayed by one delay unit; generating one or more powers of the signal; inputting one or more of the generated powers of the input signal through one or more tapped delay lines, each tapped delay line having one or more nonlinear digital filter taps, each nonlinear digital filter tap other than a first nonlinear digital filter tap being successively delayed by one delay unit;

applying the coefficients to the linear and nonlinear digital filter taps; summing each of the nonlinear digital filter taps corresponding to a certain number of delay units; and adding the sum of each of the delay units from the summing step to a particular linear digital filter tap.

Still other aspects, features, and advantages of the present invention are readily apparent from the following detailed description, by illustrating a number of exemplary embodiments and implementations, including the best mode contemplated for carrying out the present invention. The present invention is also capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The embodiments of the present invention are illustrated by way of example, and not by way of limitation, in the figures of the accompanying drawings and in which like reference numerals refer to similar elements and in which.

DETAILED DESCRIPTION OF THE PREFERRED EMBODIMENTS

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
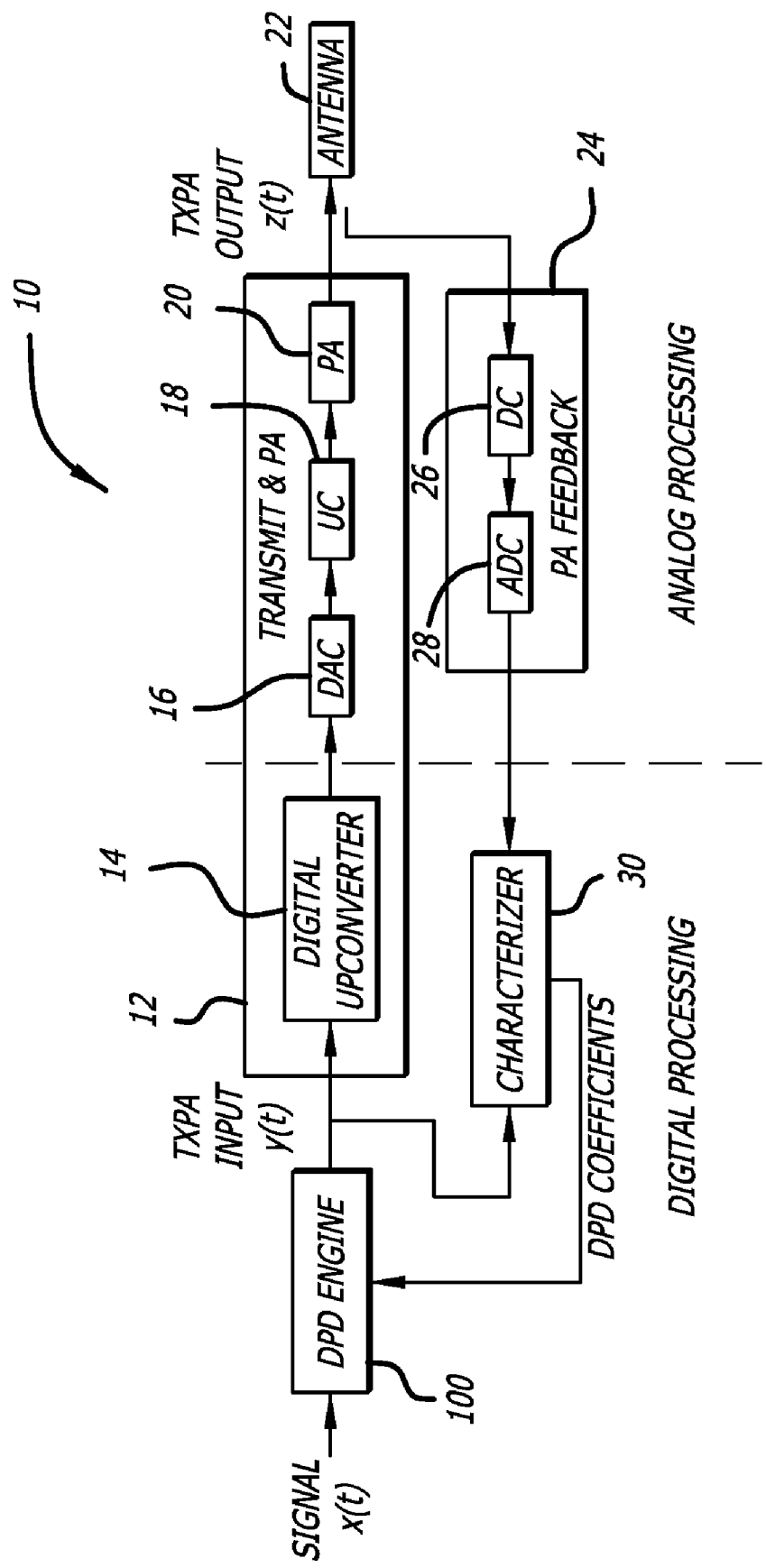
FIG. 1 is a block diagram of an illustrative implementation of a transmitter implemented in accordance with the present teachings.

FIG. 1 is a block diagram of an illustrative implementation of a transmitter implemented in accordance with the present teachings. The inventive transmitter 10 includes a conventional transmitter 12 with a digital upconverter 14, a DAC 16, an analog upconverter (UC) 18 and a power amplifier 20. The digital upconverter 14 converts a baseband input signal y(t) to intermediate frequency (IF) and the analog upconverter 18 converts the analog IF signal to radio frequency (RF) for amplification by the power amplifier 20. The output z(t) of the power amplifier 20 is fed to a conventional RF antenna 22 for transmission.

In accordance with the present teachings, linearization of the performance of the transmitter 12 is effected by a DPD engine 100. The DPD engine performs an inverse filtering of the transmitter 12 using coefficients supplied by a characterizer 30 in a feedback path thereof. As discussed more fully below, the characterizer computes the coefficients of a feedback compensation filter (i.e., using the receive path equalization process) and solves the normal equation during normal operation to compute the weights of the DPD block that are used to provide predistortion. Those skilled in the art will appreciate that the digital processing may be implemented in software using a general purpose microprocessor or other suitable arrangement.

In operation, a complex in-phase and quadrature (I-Q) input signal x(t) is sent to the DPD engine 100 and passes through a set of filters. As discussed more fully below, these filters are non-linear filters with programmable complex weights provided by a characterizer 30. The output of the DPD engine 100 is a predistorted I-Q sample stream.

The transmitter 12 converts the I-Q samples of the DPD output into an RF signal at the desired frequency and power level for transmission. The outputs from the DPD engine 100 are processed by the digital upconverter 14, which converts the I-Q signal into IF digital samples. The IF digital samples are then converted to an analog IF signal by the DAC 16 and are then frequency shifted by the RF upconverter 18 to produce an RF signal. This signal is then amplified using the power amplifier (PA). The linearized output of the transmitter 12 at the desired power level is then sent to the transmit antenna 22.

In accordance with the present teachings, this linearized output is achieved by simultaneously capturing data after the DPD block and at the feedback input in the characterizer 30. The data is correlated/shifted, scaled, combined with noise, and then solved for the predistortion coefficients which are averaged with the previously computed-weights and then applied on the transmit data in the DPD block. This data capture and weight computation is then repeated continuously. Sampling of the PA output is effected by coupling off a signal from the PA output with attenuation of the signal on the line from the PA output to a feedback circuit 24 that includes a down converter 26 and an analog to digital converter (ADC) 28. The down converter 26 converts the signal to intermediate frequency (IF). The ADC 28 converts the IF signal to digital form and feeds the digital samples to the characterizer 30.

The characterizer 30 computes the coefficients of the inverse filter for the transmitter 12 such that the PA output signal z(t) is linearized with respect to the input signal x(t). As discussed more fully below, the samples from the receive feedback path into the characterizer first pass-through a feedback compensation filter whose coefficients were computed by the characterizer to remove the distortion generated in the feedback section, after which the DPD output and the compensated signal are then time aligned and scaled (scaling is not shown in the invention but is a crucial step although a trivial one since the scaling is fixed). Then a DPD coefficient estimator solves a set of normal equations producing weights. Finally these weights are averaged to produce the coefficients for the DPD engine. The more detailed description of these blocks follows below.

From equation 4 of A Robust Digital Baseband Predistorter Constructed Using Memory Polynomials, by Lei Ding, G. Tong Zhou, Zhengriang Ma, Dennis R. Morgan, J. Stevenson Kenney, Jaehyeong Kim, Charles R. Giardina. C. Manuscript submitted to IEEE Trans. On Communication, Mar. 16, 2002, the PA can be modeled as $$y(n) = \sum_{k=1}^{K} \sum_{q=0}^{Q} a_{kq} |x(n-q)|^{k-1} x(n-q) \quad [1]$$

where x is the input to the PA, $a_{kq}=c_{kq}e^{j\Phi_{kq}}$. Similarly, if we want to predistort the signal, we implement a structure equivalent to the PA model, $$y(n) = \sum_{k=1}^{K} \sum_{q=0}^{Q} w_{kq} |x(n-q)|^{k-1} x(n-q) \quad [2]$$

where $w_{kq}=a_{kq}e^{j\Phi_{kq}}$, and x(t) and y(t) are DPD input and output respectively. A practitioner may use only the odd k terms in the first summation since the even terms correspond to out-of-band harmonics which are not of interest in the illustrative application. However, performance can be enhanced by using these terms. Equation 2 can be realized with a structure based on the following manipulation thereof:

$$y(n) = \sum_{q=0}^{Q} \sum_{k=1}^{K} w_{kq} |x(n-q)|^{k-1} x(n-q) \quad [3]$$

$$= \sum_{q=0}^{Q} \left( \sum_{k=1}^{K} w_{kq} |x(n-q)|^{k-1} \right) x(n-q)$$

The inner summation in parenthesis can be viewed as a filter for a fixed 'k'. This feature is exploited in the hardware implementation.

The processing sequence of the data input to the DPD is as follows:

Select the parameters K (K is odd) and Q for the DPD engine.

1. Compute the signal amplitude |x(n)|, and subsequently compute the powers $|x(n)|^2$, $|x(n)|^3$, $|x(n)|^4$, ..., $|x(n)|^{K-1}$.

2. The signals $|x(n)|^k$, k=1, 2, 3, ..., K-1 are sent to a tapped delay line to generate $|x(n-q)|^k$, k=1, 2, 3, ..., K-1, q=0, 1, ..., Q.

3. The signals $|x(n-q)|^k$ are multiplied with the coefficients $w_{kq}$ and the results are summed to produce the combined weights:

$$\sum_{k=1}^{K} w_{kq} |x(n-q)|^{k-1} \quad [4]$$

4. The combined weights are then used as coefficients for filtering the signal x(t) to produce the signal:

$$y(n) = \sum_{q=0}^{Q} \left( \sum_{k=1}^{K} w_{kq} |x(n-q)|^{k-1} \right) x(n-q) \quad [5]$$

The coefficients, $w_{kq}$, used in the data path implementation of the DPD engine are generated by the characterizer 30 as discussed more fully below and illustrated in FIG. 2.

Figure 2:
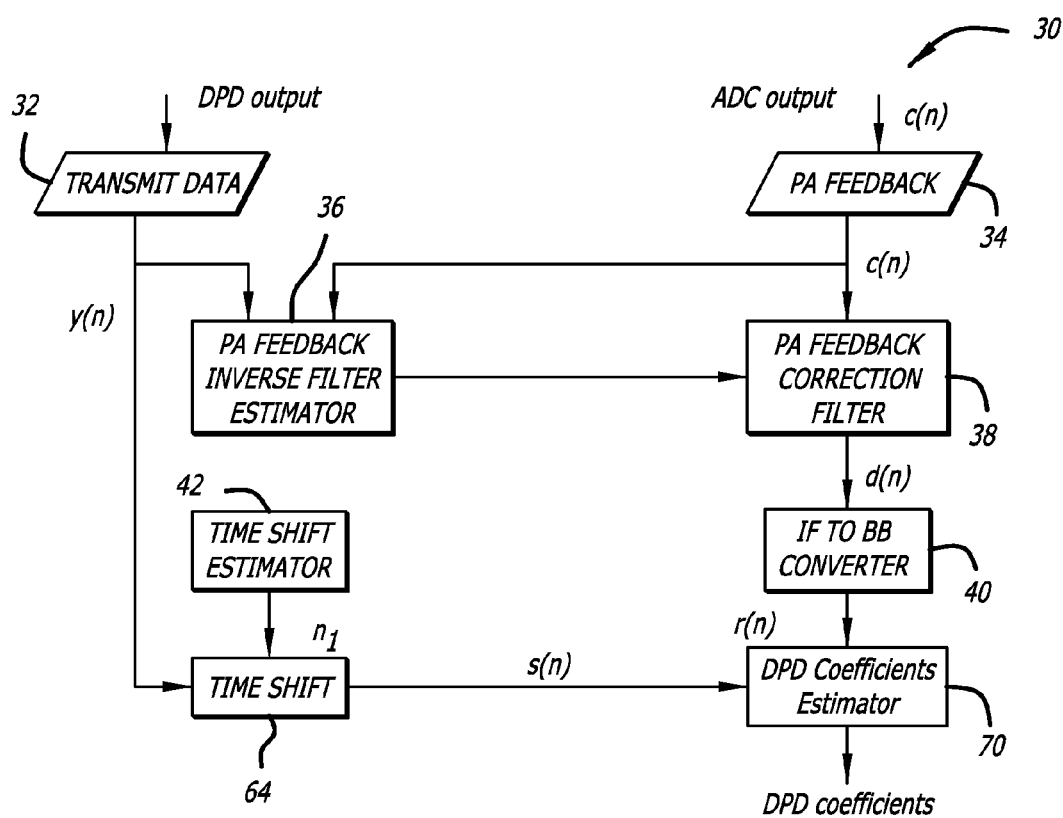
FIG. 2 is a block diagram of an illustrative implementation of a characterizer in accordance with the teachings of the present invention.

FIG. 2 is a block diagram of an illustrative implementation of a characterizer 30 in accordance with the teachings of the present invention. The transmit data and the PA feedback data are stored in random access memory (RAM) 32 and 34 respectively for signal processing in batch mode. While the transmit data phase is known, the PA feedback data is an IF signal and its phase is dependent on the time interval during which the data is collected. Thus it is necessary to capture the data at the time of known phase in relation to the phase of the transmit data phase at the DPD output so that the computed DPD coefficients can be averaged to increase accuracy.

Figure 3:
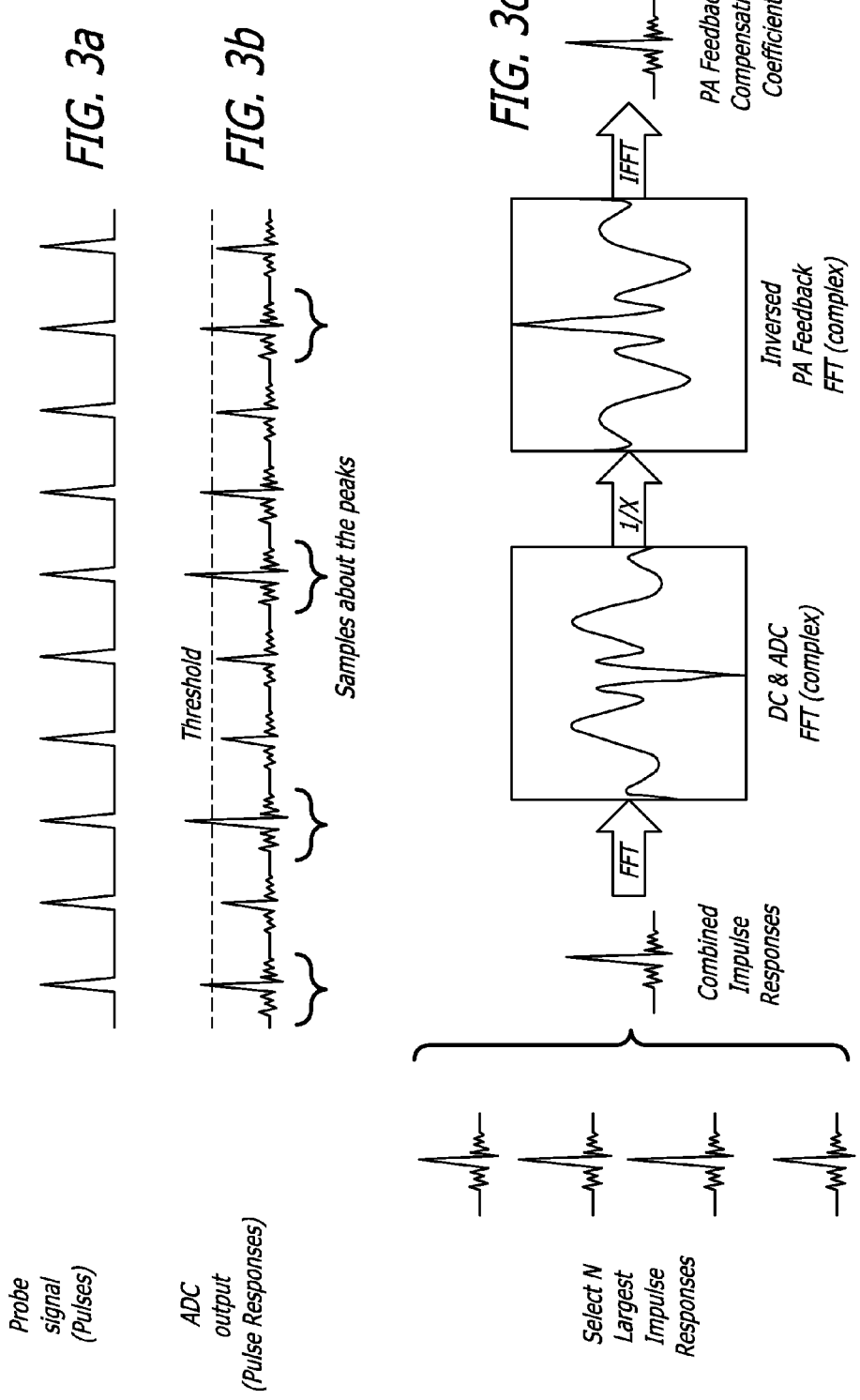
FIG. 3 is a series of timing diagrams illustrative of the process of calibration of the receive feedback path in accordance with an illustrative embodiment of the present teachings.

FIG. 3 is a series of timing diagrams illustrative of the process of initialization and compensation filter coefficient calculation in accordance with an illustrative embodiment of the present teachings. As illustrated in FIG. 3a, during the initialization process a stream of impulses are transmitted using a signal generator or DAC at the input to the feedback path just after the coupling means.

As illustrated in FIG. 3b, samples output by the ADC 28 are collected and samples surrounding the peaks that exceed a threshold are stored. These samples are represented as:

$$\begin{matrix} & \text{Peak} & & & & \\ 1^{st} \text{ pulse} & \begin{bmatrix} r_{11} & \ldots & r_{1k} & \ldots & r_{M1} \\ r_{21} & \ldots & r_{2k} & \ldots & r_{M2} \\ \ldots & \ldots & \ldots & \ldots & \ldots \\ \ldots & \ldots & \ldots & \ldots & \ldots \\ r_{M1} & \ldots & r_{Mk} & \ldots & r_{MN} \end{bmatrix} \\ 2^{nd} \text{ pulse} & \\ \ldots & \\ \ldots & \\ M^{th} \text{ pulse} & \end{matrix} \quad [6]$$

The impulse responses are averaged to improve the signal-to-noise ratio to produce the mean impulse response as:
Peak $$c(t)=[c_1 \ldots c_k \ldots c_N] \quad [7]$$

As illustrated in FIG. 3c, a processor (not shown) in the characterizer 30 then computes the Fast Fourier Transform (FFT) of this impulse response to produce the spectral response of RF down converter 26 and the ADC 28. Hence, the processor and associated software implement a PA feedback inverse filter estimator 36. Note that zeros are padded to produce the desired number of samples that the PA Feedback correction filter will use.

$$C(f)=\text{FFT}(c(t))=\text{FFT}([c_1 c_2 c_3 \ldots c_N 000 \ldots 0]) \quad [8]$$

The spectral response of the PA Feedback path filter is then computed as follows:

$$D(f)=1/C(f) \quad [9]$$

and the inverse FFT is used to determine the coefficients for the PA Feedback compensation filter d(t):

$$d(t)=\text{IFFT}(D(f)) \quad [10]$$

It is noted that this process is only performed only during system initialization, or per request.

The feedback compensation filter coefficients output by the estimator 36 are input to a feedback correction filter 38. The feedback correction filter 38 is a finite impulse response filter with N taps. The coefficients of this filter are extracted as set forth above. This filter removes any distortion caused by the RF down converter 26 and ADC 28.

The output of the PA feedback correction filter 38 is an IF signal and it is necessary to convert it into a baseband signal in I-Q form for subsequent signal processing.

Figure 4:
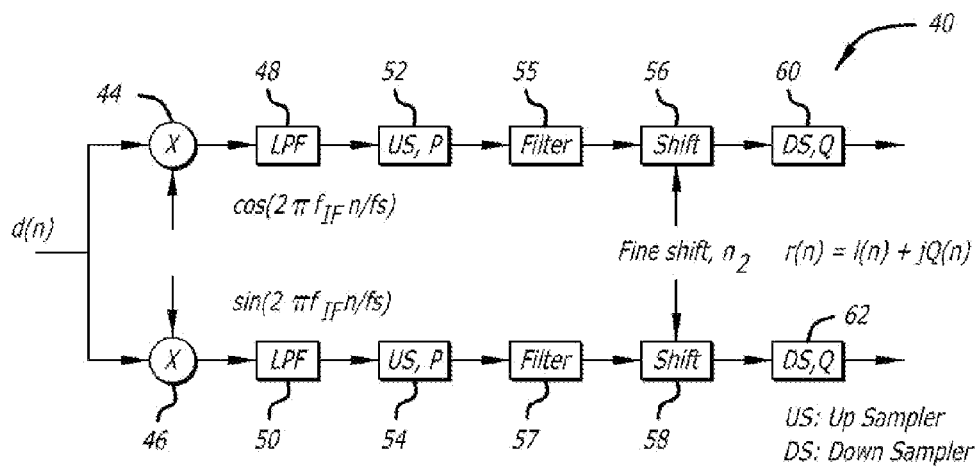
FIG. 4 is a block diagram of an illustrative implementation of the IF to baseband converter.

FIG. 4 is a block diagram of an illustrative implementation of the IF to baseband converter 40. The output of the feedback correction filter 40 is first multiplied by $\cos(2\pi f_{IF} n/f_s)$ and $\sin(2\pi f_{IF} n/f_s)$ via multipliers 44 and 46 respectively. These outputs are fed through low-pass filters 48 and 50 to extract a baseband signal centered at DC. Since the ADC 28 (FIG. 1) may have an output sample rate different than the sample rate in the DPD engine 100, assume that the ratio between the DPD rate and the ADC sample rate is P/Q. Then the outputs of the low pass filters are up-sampled by a factor of P (by up-sampling circuits (US) 52 and 54) and filtered by filters 55 and 57. Following a time shift via shifters 56 and 58, these signals are then filtered and down-sampled (DS) by a factor of Q by down-sampling circuits 60 and 62. The output signals are baseband I-Q signals having the same sampling rate as the DPD engine.

The shifters 56 and 58 placed between the up-samplers 52, 54 and down-samplers 60, 62 refine the time $t_2$ during the time synchronization. After the synchronization, this time shift $t_2$ is kept constant.

As mentioned above, the time synchronization is required to align the DPD output signal and the output of the PA Feedback Correction Filter. The time offset error is deterministic and is due to the latency delay in the transmit and receive paths. After synchronization, the time shift will maintain a constant value since the time drift is insignificant.

The correlation process to align the signal is as follows:

Coarse Correlation (a) First, note that there are multiple possible values of n2 in FIG. 4 that will give different results for r. Since r is a function of n2, we will so indicate only during the correlation discussion by writing the output as r(n, n2). After finding the optimal value for n2, we apply it as in FIG. 4 and drop the n2 from the r notation. We compute the correlation between input y(n) and output r(n, n2) signals over +/−L sample shift with n2=0 as follows:

$$R(l) = \left| \sum_{i=1} y(i-l) \cdot r^*(i, 0) \right|, \quad [11]$$

for $l = -L, -L+1, \ldots, 0, \ldots, L-1, L$ (b) Search for the shift l that yields maximum correlation R(l). $n_1 = l_{max}$ is the coarse shift; and (c) Output the time shift $n_1$.

Since the correlation R(l) has the sampling rate of $f_s$, the time correlation is accurate to $\pm 1/(2f_s)$ Fine Correlation (a) After the coarse time sync, compute correlation between shifted input $y(n-n_1)$ and output r(n, n2) signals over $n2 \ni \{-2, -1, 0, 1, 2\}$ sample in time shift where n2 functions as shown in FIG. 4;

$$R(g) = \left| \sum_{i=1} y(i-n_1) \cdot r^*(i, g) \right|, \quad [12]$$

for $g = -2, -1, 0, 1, 2$ (b) Search for the shift g that yields maximum correlation R(g). $n_2 = g_{max}$ is the fine shift;

(c) Output the time shift $n_2$; and (d) Since the correlation R(g) has the sampling rate of $Qf_s$, the time correlation is accurate to $\pm 1/(2Qf_s)$.

DPD Coefficients Estimator

After the signals s(n) and r(n) are aligned in time by a time shift estimator 42 and time shifters 56, 58 and 64, the DPD weights are estimated by a DPD coefficients estimator 70. The objective is to solve the DPD equation as defined in [3]:

$$s(n) = \sum_{q=0}^{Q} \sum_{k=1}^{K} w_{kq} |r(n-q)|^{k-1} r(n-q) \quad [13]$$

where s(n) is derived from the DPD output and r(n) is derived from the PA Feedback output.

Figure 5:
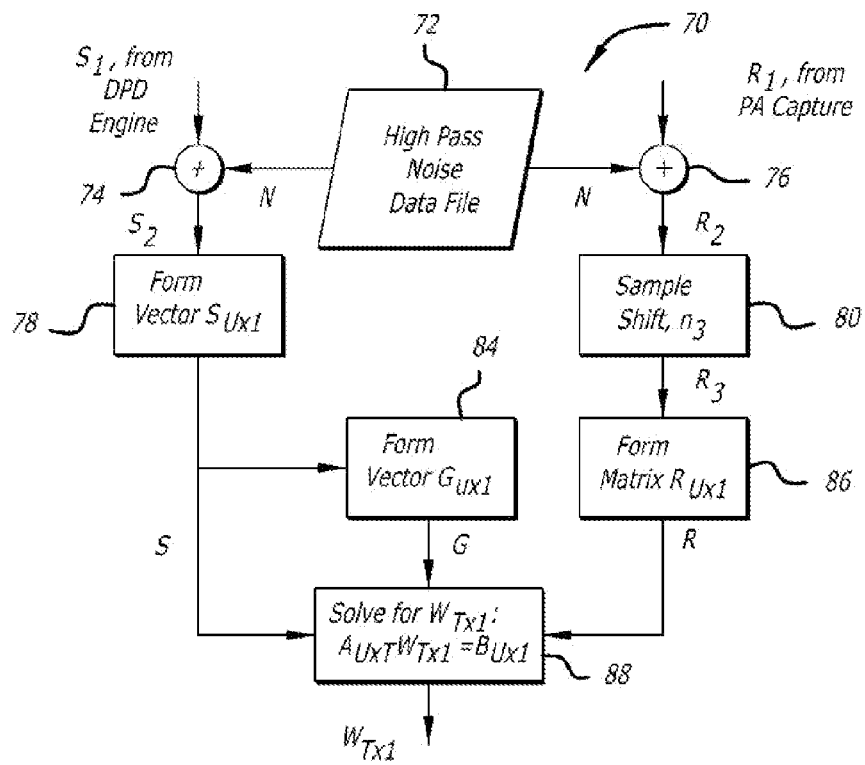
FIG. 5 is a block diagram of an illustrative implementation of a DPD coefficients estimator in accordance with the present teachings.

FIG. 5 is a block diagram of an illustrative implementation of a DPD coefficients estimator in accordance with the present teachings. The inputs S1 is s(n) and R1 is r(n) from the above discussion. The process for weight estimation is described below.

High Pass Noise Generation

Because both the signal s(n) and r(n) have narrow bandwidths relative to the DPD sampling frequency, the estimation of the weights may exhibit undesirable behavior at high frequencies where little signal content exists. To prevent this from happening, either a properly scaled all-pass or high-pass signal (pre-stored in a RAM 72 or generated using a random noise generator such as a pn linear feedback shift register), is added to both signals s(n) and r(n) at steps 74 and 76. This added all-pass or high-pass signal ensures bounded, stable weights and also greatly improves weight averaging.

The new signals with the added signal are expressed as:

$$S_2 = S_1 + N \quad [14]$$

$$R_2 = R_1 + N \quad [15]$$

where $S_1$ and $R_1$ are the processed DPD samples and the processed IF to BB converter output, respectively.

Soft Factor

When operating near saturation of the PA, the peak amplitude of the DPD output s(n) will increase as the DPD loop progresses, but the amplitude of the ADC output will be remain saturated due to PA compression. This is always the case for a PA with an input versus output amplitude profile which curves very flat very quickly, i.e. it becomes highly saturated, and the user has selected a low K and small Q which will not provide an accurate solution for W. A perfect PA has a linear transfer function, output=100*input, i.e., a straight line. A real PA will start to tail off from linear as the input power is increased eventually hitting a maximum output power no matter how much the input power is increased (it becomes a flat line at this time), so the transfer function ends up looking like a hockey stick. The soft factor is used to remove the samples s(n) with very strong amplitude from consideration in solving for the weights in equation [5]. Let $$S = [s(0) s(1) s(2) s(3) \ldots s(U-1)]^T \quad [16]$$

be the processed DPD signal samples, the soft factor vector is expressed as:

$$G = [g(0) g(1) g(2) g(3) \ldots g(U-1)]^T \quad [17]$$

where $g(i) = 1$ for $|s(i)| < T_2$ $g(i) = 0$ otherwise, and $T_2$ is the user chosen threshold that controls how large the samples are that will be processed. This soft factor vector will be used to help solve for the weights with high accuracy.

Sampling Shift $n_3$

The distribution of the weight W between [0-Q] impacts the accuracy of the DPD engine. In order to maximize the accuracy of the DPD=PA$^{-1}$ estimation process, it is necessary to place the weight distribution correctly, by shifting the delay $n_3$ between from 0 to Q and checking for the residue error E as defined in Equation 26. The output of the sample Shift is expressed as:

$$R_3(n)=R_2(n-n_3) \quad [18]$$

DPD Weight Estimator

The DPD equation can be expressed as:

$$s(n) = \sum_{q=0}^{Q} \sum_{k=1}^{K} w_{kq} |r(n-q)|^{k-1} r(n-q) \quad [19]$$

Let U be the number of observation samples. The above equation can be expressed in this form:

$$S_{U\times 1} = H_{U\times T} W_{T\times 1} \quad [20]$$

where $$T = \tfrac{1}{2}(N+1)(Q+1) \quad [21]$$

$$S = [s(0) \cdot g(0) s(1) \cdot g(1) s(2) \cdot g(2) s(3) \cdot g(3) \ldots s(U-1) \cdot g(U-1)] \quad [22]$$

$$H = [h_{10} h_{30} \ldots h_{K0} | h_{11} h_{31} \ldots h_{K1} | \ldots \ldots | h_{1Q} h_{3Q} \ldots K_{KQ}] \quad [23]$$

$$h_{ij} = [s_{ij}(0) \cdot g(0) s_{ij}(1) \cdot g(1) s_{ij}(2) \cdot g(1) s_{ij}(3) \cdot g(3) \ldots s_{ij}(U-1) \cdot g(U-1)]^T \quad [24]$$

and $$W = [w_{10} w_{30} \ldots w_{K0} | w_{11} w_{31} \ldots w_{K1} | \ldots \ldots | w_{1Q} w_{3Q} \ldots w_{KQ}]^T \quad [25]$$

Note that the equation $S_{U\times 1}=H_{U\times T}W_{T\times 1}$ was modified to take into account the soft factor G. The normal equation [20] can be solved with QR method or Matrix inversion technique to estimate the coefficient set W.

The residue error for this estimation is:

$$E = \|S_{U\times 1} - H_{U\times T} \hat{W}_{T\times 1}\|^2$$

where $\hat{W}_{T\times 1}$ is the computed weight vector.

Coefficient Averaging

After solving for the coefficients W(t) using samples taken at discrete times t (t=0, 1, 2, . . . ), the coefficient set can be expressed as:

$$W(t) = \begin{bmatrix} w_{10}(t) & w_{11}(t) & \ldots & w_{1Q}(t) \\ w_{20}(t) & w_{21}(t) & \ldots & w_{2Q}(t) \\ \ldots & \ldots & \ldots & \ldots \\ w_{K0}(t) & w_{K1}(t) & \ldots & w_{KQ}(t) \end{bmatrix} \quad [27]$$

The phase of the fundamental component at DC is expressed as:

$$\theta_1(t) = \text{angle}\left(\sum_{q=0}^{Q} w_{1q}(t)\right) \quad [28]$$

It is necessary to maintain this fundamental component phase as zero to ensure that the DPD block does not provide phase rotation of the desired signal. Thus, the new coefficient set $W_2(t)$ is expressed as:

$$W_2(t) = \begin{bmatrix} w_{10}(t) & w_{11}(t) & \ldots & w_{1Q}(t) \\ w_{20}(t) & w_{21}(t) & \ldots & w_{2Q}(t) \\ \ldots & \ldots & \ldots & \ldots \\ w_{K0}(t) & w_{K1}(t) & \ldots & w_{KQ}(t) \end{bmatrix} e^{-j\theta_1(t)} \quad [29]$$

Now, since all of the weights have the same fundamental component phase and are also highly correlated, the coefficients can be filtered to improve the signal to noise ratio. The filter coefficient set is expressed as:

$$W_3(t+1) = (1-\alpha) W_3(t) + \alpha W_2(t+1) \quad [30]$$

where $W_2(t)$ is the coefficient set per data taken and $W_3(t)$ is the filtered coefficient set.

As noted above, the transmitter 12 (FIG. 1) can be modeled as a combination of multiple filters, where each filter is associated with an intermodulation order with its own amplitude, phase and delay, linearization may be achieved using multiple filters with weights designed to effect an inverse or reciprocal operation. Such that when the signal output by the DPD engine is processed by the power amplifier 20 of the transmitter 12 the performance of the transmitter 12 is improved with respect to the efficiency thereof. As the generation of the DPD coefficients is set forth above, these coefficients are utilized in the manner depicted in FIG. 6 to implement the DPD engine 100.

Figure 6:
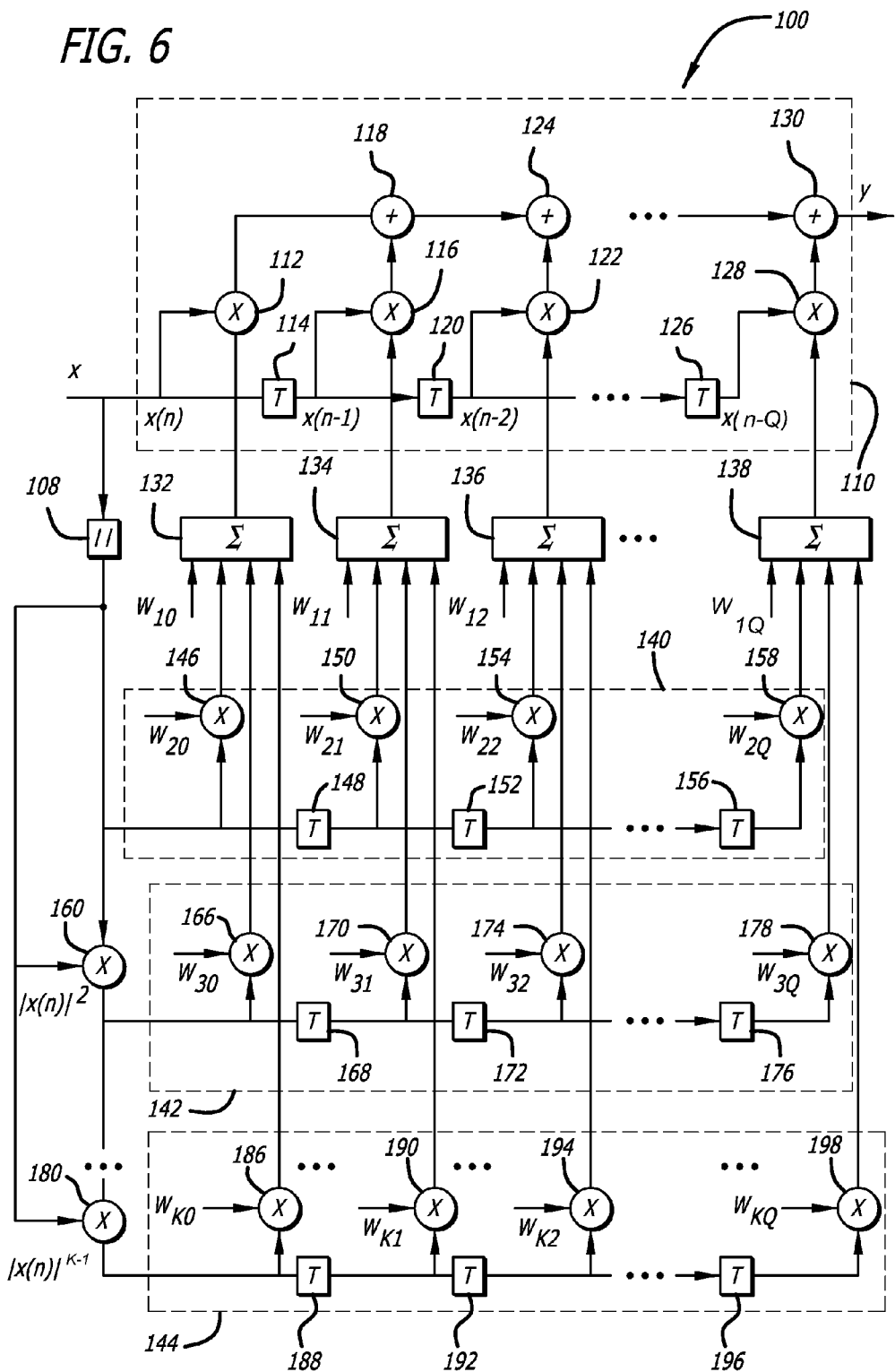
FIG. 6 is a simplified block diagram of a DPD engine implemented in accordance with an illustrative embodiment of the present teachings.

FIG. 6 is a simplified block diagram of a DPD engine implemented in accordance with an illustrative embodiment of the present teachings. As shown in FIG. 6, the engine 100 includes a complex finite impulse response (FIR) filter 110 with 'Q' taps. The amplitude of the input signal 'x' is computed at 108 by an absolute value operation. This signal is fed forward to a series of multipliers 160 . . . 180, each of which multiply the input signal by the output of the previous multiplier. As a result, a number of products are available each of which being a sample of the input signal raised to consecutive powers. Each of these products is fed to one of K tapped delay lines 140, 142, . . . 144. Each delay line has a Q+1 multipliers e.g., 146, 150, 154, . . . 158 and Q delay elements e.g., 148, 152, . . . 156. A plurality (Q) of summers or summation operations 132, 134, 136 . . . 138 are included. Those skilled in the art will appreciate that the engine 100 depicted in FIG. 6 utilizes the coefficients generated above in accordance with equations [1]-[30] above to provide predistorted input signals to effect linearization of the operation of the transmitter 12 as discussed herein.

The devices and subsystems of the exemplary embodiments of FIGS. 1-6 can include computer readable medium or memories for holding instructions programmed according to the teachings of the present invention and for holding data structures, tables, records, and/or other data described herein. Computer readable medium can include any suitable medium that participates in providing instructions to a processor for execution. Such a medium can take many forms, including but not limited to, non-volatile media, volatile media, etc. Non-volatile media can include, for example, optical or magnetic disks, magneto-optical disks, and the like. Volatile media can include dynamic memories, and the like. Transmission media can include coaxial cables, copper wire, fiber optics, and the like. Common forms of computer-readable media can include, for example, a floppy disk, a flexible disk, hard disk, magnetic tape, any other suitable magnetic medium, a CD-ROM, CDRW, DVD, any other suitable optical medium, a RAM, a PROM, an EPROM, a FLASH- EPROM, any other suitable memory chip or cartridge, or any other suitable medium from which a computer can read.

While the present inventions have been described in connection with a number of exemplary embodiments, and implementations, the present inventions are not so limited, but rather cover various modifications, and equivalent arrangements, which fall within the purview of the appended claims.

What is claimed is:

1. A method for operating a linearizer for a circuit, the method comprising:
   generating a set of coefficients via a characterizer means coupled to an input to and an output from the circuit;
   predistorting a signal input to the circuit via predistortion means responsive to the coefficients and generating via the circuit a linearized output in response thereto;
   providing in the predistortion means circuitry configured for performing the steps of:
   filtering the signal through a linear digital filter having one or more linear digital filter taps, each linear digital filter tap other than a first linear digital filter tap being successively delayed by one delay unit;
   generating one or more powers of the signal;
   inputting one or more of the generated powers of the signal through one or more tapped delay lines, each tapped delay line having one or more nonlinear digital filter taps, each nonlinear digital filter tap other than a first nonlinear digital filter tap being successively delayed by one delay unit;
   applying the coefficients to the linear and nonlinear digital filter taps;
   summing each of the nonlinear digital filter taps corresponding to a certain number of delay units; and
   adding the sum of each of the delay units from the summing step to a particular linear digital filter tap.

2. The method of claim 1, wherein the circuit is a power amplifier.

3. The method of claim 1, wherein the predistortion means is a digital predistortion linearizer.

4. A computer program product for operating a linearizer for a circuit, and including one or more computer readable instructions embedded on a computer readable medium and configured to cause one or more computer processors to perform the steps of:
   generating a set of coefficients via a characterizer means coupled to an input to and an output from the circuit;
   predistorting a signal input to the circuit via predistortion means responsive to the coefficients and generating via the circuit a linearized output in response thereto;
   providing in the predistortion means circuitry configured for performing the steps of:
   filtering the signal through a linear digital filter having one or more linear digital filter taps, each linear digital filter tap other than a first linear digital filter tap being successively delayed by one delay unit;
   generating one or more powers of the signal;
   inputting one or more of the generated powers of the signal through one or more tapped delay lines, each tapped delay line having one or more nonlinear digital filter taps, each nonlinear digital filter tap other than a first nonlinear digital filter tap being successively delayed by one delay unit;
   applying the coefficients to the linear and nonlinear digital filter taps;
   summing each of the nonlinear digital filter taps corresponding to a certain number of delay units; and
   adding the sum of each of the delay units from the summing step to a particular linear digital filter tap.

5. The computer program product of claim 4, wherein the circuit is a power amplifier.

6. The computer program product of claim 4, wherein the predistortion means is a digital predistortion linearizer.

7. A method for operating a transmitter, the method comprising:
   receiving an input signal and providing a linearized output signal in response thereto via a digital predistortion engine;
   coupling a power amplifier to the predistortion engine;
   coupling a characterizer to the power amplifier;
   providing in the predistortion engine circuitry configured for performing the steps of:
   filtering the input signal through a linear digital filter having one or more linear digital filter taps, each linear digital filter tap other than a first linear digital filter tap being successively delayed by one delay unit;
   generating one or more powers of the input signal;
   inputting one or more of the generated powers of the input signal through one or more tapped delay lines, each tapped delay line having one or more nonlinear digital filter taps, each nonlinear digital filter tap other than a first nonlinear digital filter tap being successively delayed by one delay unit;
   applying coefficients to the linear and nonlinear digital filter taps;
   summing each of the nonlinear digital filter taps corresponding to a certain number of delay units; and
   adding the sum of each of the delay units from the summing step to a particular linear digital filter tap.

8. A computer program product for operating a transmitter, and including one or more computer readable instructions embedded on a computer readable medium and configured to cause one or more computer processors to perform the steps of:
   receiving an input signal and providing a linearized output signal in response thereto via a digital predistortion engine;
   coupling a power amplifier to the predistortion engine;
   coupling a characterizer to the power amplifier;
   providing in the predistortion engine circuitry configured for performing the steps of:
   filtering the input signal through a linear digital filter having one or more linear digital filter taps, each linear digital filter tap other than a first linear digital filter tap being successively delayed by one delay unit;
   generating one or more powers of the input signal;
   inputting one or more of the generated powers of the input signal through one or more tapped delay lines, each tapped delay line having one or more nonlinear digital filter taps, each nonlinear digital filter tap other than a first nonlinear digital filter tap being successively delayed by one delay unit;
   applying coefficients to the linear and nonlinear digital filter taps;
   summing each of the nonlinear digital filter taps corresponding to a certain number of delay units; and
   adding the sum of each of the delay units from the summing step to a particular linear digital filter tap.

9. A linearizer for an output of a circuit, comprising:
   means for sampling a signal into the circuit and output by the circuit;
   means for generating a set of coefficients in response to the sampling step;

means for using the coefficients to predistort a signal input to the circuit whereby the circuit generates a linearized output in response thereto; and the means for predistorting the signal further includes:

means for filtering the signal through a linear digital filter having one or more linear digital filter taps, each linear digital filter tap other than a first linear digital filter tap being successively delayed by one delay unit;

means for generating one or more powers of the signal;

means for inputting one or more of the generated powers of the input signal through one or more tapped delay lines, each tapped delay line having one or more nonlinear digital filter taps, each nonlinear digital filter tap other than a first nonlinear digital filter tap being successively delayed by one delay unit;

means for applying the coefficients to the linear and nonlinear digital filter taps;

means for summing each of the nonlinear digital filter taps corresponding to a certain number of delay units; and means for adding the sum of each of the delay units from the summing step to a particular linear digital filter tap.

10. A computer program product for linearizing an output of a circuit, and including one or more computer readable instructions embedded on a computer readable medium and configured to cause one or more computer processors to perform the steps of:

sampling a signal into the circuit and output by the circuit;

generating a set of coefficients in response to the sampling step;

using the coefficients to predistort a signal input to the circuit whereby the circuit generates a linearized output in response thereto; and the predistortion of the signal further includes:

filtering the signal through a linear digital filter having one or more linear digital filter taps, each linear digital filter tap other than a first linear digital filter tap being successively delayed by one delay unit;

generating one or more powers of the signal;

inputting one or more of the generated powers of the input signal through one or more tapped delay lines, each tapped delay line having one or more nonlinear digital filter taps, each nonlinear digital filter tap other than a first nonlinear digital filter tap being successively delayed by one delay unit;

applying the coefficients to the linear and nonlinear digital filter taps;

summing each of the nonlinear digital filter taps corresponding to a certain number of delay units; and adding the sum of each of the delay units from the summing step to a particular linear digital filter tap.

* * * * *